United States Patent
Li et al.

(10) Patent No.: US 9,722,071 B1
(45) Date of Patent: Aug. 1, 2017

(54) TRENCH POWER TRANSISTOR

(71) Applicant: SINOPOWER SEMICONDUCTOR, INC., Hsinchu (TW)

(72) Inventors: Po-Hsien Li, Tainan (TW); Guo-Liang Yang, Hsinchu (TW); Jia-Fu Lin, Yilan County (TW); Wei-Chieh Lin, Hsinchu (TW)

(73) Assignee: SINOPOWER SEMICONDUCTOR, INC., Hsinchu (TW)

( * ) Notice: Subject to any disclaimer, the term of this patent is extended or adjusted under 35 U.S.C. 154(b) by 0 days.

(21) Appl. No.: 15/005,130

(22) Filed: Jan. 25, 2016

(51) Int. Cl.
| | | |
|---|---|---|
| H01L 29/66 | (2006.01) | |
| H01L 29/78 | (2006.01) | |
| H01L 29/423 | (2006.01) | |
| H01L 29/40 | (2006.01) | |
| H01L 29/10 | (2006.01) | |
| H01L 29/08 | (2006.01) | |
| H01L 23/29 | (2006.01) | |
| H01L 23/31 | (2006.01) | |

(52) U.S. Cl.
CPC ........ *H01L 29/7813* (2013.01); *H01L 23/291* (2013.01); *H01L 23/3171* (2013.01); *H01L 29/0865* (2013.01); *H01L 29/1095* (2013.01); *H01L 29/407* (2013.01); *H01L 29/4236* (2013.01); *H01L 29/7806* (2013.01); *H01L 29/7811* (2013.01)

(58) Field of Classification Search
None
See application file for complete search history.

(56) References Cited

U.S. PATENT DOCUMENTS

2013/0330892 A1* 12/2013 Hsieh ............... H01L 29/66825
438/259

* cited by examiner

*Primary Examiner* — Long Pham
(74) *Attorney, Agent, or Firm* — Li & Cai Intellectual Property (USA) Office

(57) ABSTRACT

A trench power transistor is provided. The trench gate structure of the trench power transistor includes at least one insulting layer, a gate electrode, and a shielding electrode, which are disposed in a trench of an epitaxial layer. The insulating layer formed on an inner wall of the active trench to isolate an epitaxial layer from the gate and the shielding electrodes. The insulating layer includes a first dielectric layer, a second dielectric layer and a third dielectric layer. The first and second dielectric layers extend from an upper portion of the inner wall to a lower portion of the inner wall of the active trench. The third dielectric layer is formed on the second dielectric layer and located at the lower portion of the active trench. A portion of the second dielectric layer is interposed between the first and third dielectric layers.

11 Claims, 12 Drawing Sheets

TRENCH POWER TRANSISTOR

BACKGROUND OF THE INVENTION

1. Field of the Invention

The instant disclosure relates to a power transistor (MOSFET); in particular, to a trench power MOSFET having a shielding electrode in the bottom of the trench.

2. Description of Related Art

Power metal-oxide-semiconductor field-effect transistors (Power MOSFET) are widely implemented in the switching devices of electric devices, such as power supplies, rectifiers or low voltage motor controllers and the like. The current power MOSFET is designed to have a vertical structure to improve the packing density. One of the advantages of the trench power MOSFET is that it is capable of controlling the operation of devices with low-power consumption.

The working loss of power MOSFET is categorized into a switching loss and a conducting loss. In addition, an intrinsic gate-to-drain capacitance (Cgd) is one of the important parameters affecting the switching loss. When the intrinsic gate-to-drain capacitance is too high, the switching loss increases, which may limit the switching speed of the power trench MOSFET and may lead to the power MOSFET being unfavorable to be implemented in high frequency circuits.

To improve the abovementioned problem and decrease the gate-to-drain capacitance (Cgd), the prior art power MOSFET has a shielding electrode formed in the gate trench and positioned at a lower portion of the gate trench.

However, during the fabricating process of the trench power MOSFET having the shielding electrode, after the step of forming the shielding electrode in the lower portion of the gate trench, a portion of the dielectric layer, which has been formed along an upper portion of an inner wall of the gate trench during previous steps, has to be removed, and then another gate dielectric layer is redeposited. Notably, during the step of etching the dielectric layer, it is difficult to control a depth of the etching process, which may result in the formations of voids or holes between the redeposited gate dielectric layer and the remained dielectric layer covering along a lower portion of the inner wall of the gate trench. When a bias is applied to the trench power MOSFET, the voids or holes in the gate trench may lead to the generation of leakage current between the gate and the source and produce a problem of poor electrical performance.

SUMMARY OF THE INVENTION

The object of the instant disclosure is to provide a trench power transistor. After the steps of forming the oxide layer and the nitride layer along an inner wall of the trench, the shielding electrode and the gate electrode are formed without removing the nitride layer to prevent the formation of the void or hole in the trench gate structure.

In order to achieve the aforementioned objects, according to an embodiment of the instant disclosure, a trench power transistor is provided. The trench power transistor includes a substrate, an epitaxial layer, a trench gate structure, a body region, and a source region. The epitaxial layer is formed on the substrate, and has at least one active trench formed therein. The trench gate structure is disposed in the active trench, and includes a shielding electrode, a gate electrode, and an insulating layer. The shielding electrode is positioned in a lower portion of the active trench, and the gate electrode is positioned in an upper portion of the active trench and insulated from the shielding electrode. The insulating layer is formed along an inner wall of the active trench and has a contour substantially conforming to a contour of the inner wall. The gate electrode is insulated from the epitaxial layer through the insulating layer. The insulating layer includes a first dielectric layer, a second dielectric layer, and a third dielectric layer, in which the third dielectric layer is positioned in the lower portion of the active trench, and a portion of the second dielectric layer located in the lower portion of the active trench is sandwiched between the first dielectric layer and the third dielectric layer. The second dielectric layer has a higher dielectric constant than that of the first dielectric layer. The body region is formed in the epitaxial layer and surrounds the trench gate structure. The source region is formed in the epitaxial layer, and located above the body region.

According to another embodiment of the instant disclosure, a trench power transistor is provided. The trench power transistor includes a substrate, a trench gate structure, a first body region, a source region, a first terminal electrode structure, a second terminal electrode structure, and at least two second body regions. The epitaxial layer is disposed on the substrate and defines an active region and a rectifying region. The trench gate structure is formed in the epitaxial layer and positioned at the active region. The first body region is formed in the active region of the epitaxial layer and surrounds the trench gate structure. The source region is formed above the first body region. The first and second terminal electrode structures are formed in the rectifying region of the epitaxial layer and adjacently arranged in parallel along a first direction. The two second body regions are formed in the epitaxial layer interposed between the first and second terminal electrode structures and mutually spaced apart a predetermined distance in a second direction to define a schottky contact region.

To sum up, the trench power transistor in accordance with the instant disclosure can avoid the formation of the voids or holes in the insulating layer. As such, when a bias is applied to the gate electrode of the trench power transistor, the gate-source leakage current (Igss) can be attenuated to improve the electrical performance of the trench power transistor.

In order to further the understanding regarding the instant disclosure, the following embodiments are provided along with illustrations to facilitate the disclosure of the instant disclosure.

DETAILED DESCRIPTION OF THE PREFERRED EMBODIMENTS

Figure 1:
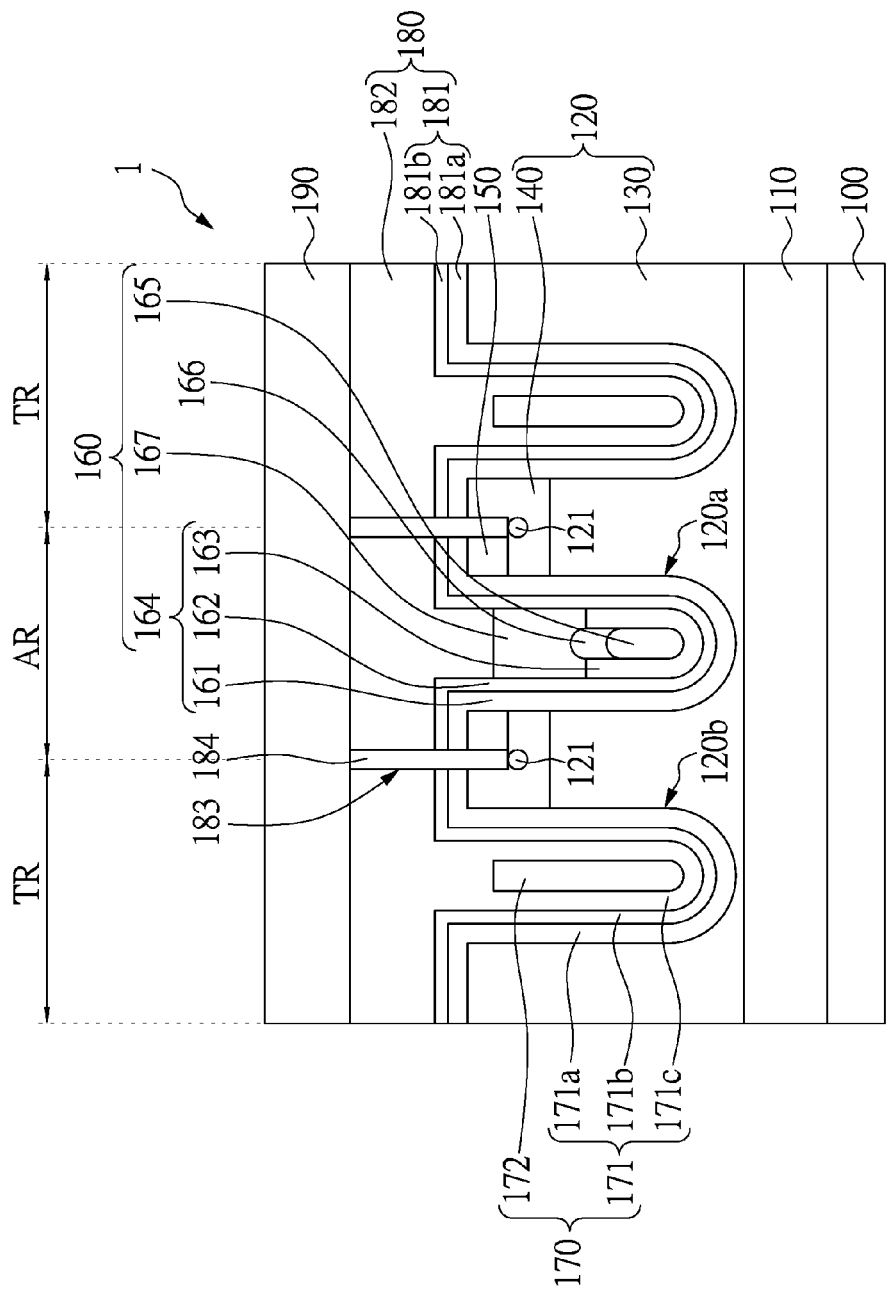
FIG. 1 shows a partial sectional view of a trench power transistor provided in accordance with an embodiment of the instant disclosure.

Please refer to FIG. 1. FIG. 1 shows a partial sectional view of a trench power transistor provided in accordance with an embodiment of the instant disclosure. The trench power transistor 1 includes a substrate 100, an epitaxial layer 120, a trench gate structure 160, a body region 140, and a source region 150.

As shown in FIG. 1, the substrate 100 is doped with a higher concentration of first conductivity type impurities to form a first heavily doped region. The first heavily doped region can serve the function of the drain of the trench power transistor, and may occupy a local region or the overall region of the substrate 100. In the instant embodiment, the first heavily doped region occupies the overall region of the substrate 100, which is only used as an example, but not so as to limit the scope of the invention. The aforementioned first conductivity type impurities may be N-type or P-type conductivity impurities. If the substrate 100 is a silicon substrate, the N-type conductivity impurities may be Group V ions such as phosphorus ions or arsenic ions, and the P-type conductivity impurities may be Group III ions such as boron ions, aluminum ions or gallium ions.

If the trench power transistor is n-type power MOSFET, the substrate 100 is doped with N-type conductivity impurities, whereas if the trench power MOSFET is p-type, the substrate 100 is doped with P-type conductivity impurities. In the embodiment of the instant disclosure, the N-type trench power MOSFET is taken as an example to describe the invention.

The epitaxial layer 120 is formed on the substrate 100 and doped with a lower concentration of the first conductivity type impurities. That is, taking the N-type trench power MOSFET for example, the substrate 100 is a heavily N-type doping (N$^+$) substrate and the epitaxial layer 120 is a lightly N-type doping (N$^-$) layer. On the contrary, taking the P-type trench power MOSFET for example, the substrate 100 is a heavily P-type doping (P$^+$) substrate and the epitaxial layer 110 is a lightly P-type doping (P$^-$) layer.

In the instant embodiment, the trench power transistor 1 includes a buffer layer 110 disposed between the epitaxial layer 120 and the substrate 100. The buffer layer 110 and the epitaxial layer 120 have the same conductivity type, i.e., the buffer layer 110 is doped with the first conductivity type impurities. It is worth noting that the buffer layer 110 has a doping concentration between the substrate 100 and the epitaxial layer 120. By forming the buffer layer 110 between the substrate 100 and the epitaxial layer 120, the source/drain on resistance (Rdson) can be decreased, such that the power consumption of the trench power transistor 1 can be lower.

Furthermore, by doping different conductivity type impurities in different regions and making the different regions have different concentrations, the epitaxial layer 120 can be divided into a drift region 130, the body region 140, and a source region 150. The body region 140 and the source region 150 are formed in the epitaxial layer 120 and immediately adjacent to at least one sidewall of the trench gate structure 160, and the drift region 130 is formed in the epitaxial layer 120 nearer to the substrate 100. That is, the body region 140 and the source region 150 are formed in an upper portion of the epitaxial layer 120, and the drift region 130 is formed in a lower portion of the epitaxial layer 120.

Specifically, the body region 140 is formed by doping second conductivity type impurities in the epitaxial layer 120, and the source region 150 is formed above the body region 140 by doping high-concentration first conductivity type impurities. For example, for N-type trench power transistor, the body region 140 is doped with p-type impurities to form a P-type dopant region, i.e., P-well, and the source region 150 is doped with n-type impurities to form a n-type dopant region. In addition, the doping concentration of the body region 140 is lower than that of the source region 150.

In addition, in the instant embodiment, the epitaxial layer 120 defines an active region AR and a termination region TR immediately adjacent to the active region AR. The body region 140 is formed in the active region AR and the termination region TR, and the source region 150 is only formed in the active region AR. The epitaxial layer 120 has at least one active trench 120a formed therein and positioned in the active region AR.

Specifically, the active trench 120a of the embodiment of the instant disclosure is a deep trench, which means the active trench 120a extends from a top surface of the epitaxial layer 120 to a depth greater than that of the body region 140, i.e., the active trench 120a extends into the drift region 130. Additionally, a bottom of the active trench 120a is closer to the substrate 100.

In the embodiment of the instant disclosure, at least one trench gate structure 160 is disposed in the corresponding active trench 120a, and the trench gate structure 160 includes a shielding electrode 165, a gate electrode 167, and an insulating layer 164.

The shielding electrode 165 is positioned at a lower portion of the active trench 120a, whereas the gate electrode 167 is positioned over and insulated from the shielding electrode 165. Specifically, the trench gate structure 160 further includes an inter-electrode dielectric layer 166. The inter-electrode dielectric layer 166 extends between the shielding electrode 165 and the gate electrode 167 so that the shielding electrode 165 and the gate electrode 167 are isolated from each other. The gate electrode 167 and the shielding electrode 165 can be made of, but are not limited to, heavily doped polysilicon. The inter-electrode dielectric layer 166 can be made of oxide (e.g., silicon oxide), nitride (e.g., silicon nitride) or other insulator, but this is not intended to limit the instant disclosure.

Notably, when the active trench is the deep trench it can help the breakdown voltage of the trench power transistor increase, but the deep trench also may result in higher gate-to-drain capacitance (Cgd) and higher source/drain on resistance (Rdson). In the embodiment of the instant disclosure, the shielding electrode 165 disposed at a bottom of the active trench 120a can reduce the gate-to-drain capacitance (Cgd) to lower the working loss. Additionally, the shielding electrode 165 may have an electric potential substantially equal to a source potential so that the charge balance in the drift region 130 can be achieved, and thus increasing the breakdown voltage. Accordingly, the drift region 130 can have relatively higher doping concentration of the impurities so that the source/drain on resistance can be reduced. Additionally, it is worth noting that in the embodiment of the instant disclosure, a lowest plane of the body region 140 is taken as a reference plane to substantially divide the active trench 120a into the upper portion and the lower portion.

The insulating layer 164 formed conformingly on an inner wall of the active trench 120a has a contour substantially conforming to a contour of the inner wall of the active trench 120a. The aforementioned inner wall includes two sidewall surfaces and a bottom surface. Both the gate electrode 167 and the shielding electrode 165 are insulated from the epitaxial layer 120 through the insulating layer 164.

Specifically, the insulating layer 164 includes a first dielectric layer 161, a second dielectric layer 162, and a third dielectric layer 163. In the instant embodiment, the first dielectric layer 161, the second dielectric layer 162, and the third dielectric layer are sequentially stacked along a direction from the inner wall of the active trench 120a to the gate electrode 167 and to the shielding electrode 165, and the third dielectric layer 163 is positioned at the lower portion of the active trench 120a. A portion of the second dielectric layer 162 positioned at the lower portion of the active trench 120a is sandwiched between the first and third dielectric layers 161, 163.

That is to say, both the first and second dielectric layers 161, 162 are formed extending from the upper portion to the lower portion (including a bottom) of the active trench 120a, and the third dielectric layer 163 is only formed in the lower portion of the active trench 120a. Accordingly, in the instant embodiment, a portion of the first dielectric layer 161 and a portion of the second dielectric layers 162 formed in the upper portion of the active trench 120a surround the gate electrode 167 and can commonly serve as a gate dielectric layer, and thus the portion of the second dielectric layer 162 formed in the upper portion of the active trench 120a is interposed between the portion of the first dielectric layer 161 and the gate electrode 167.

In addition, another portion of the first dielectric layer 161 and another portion of the second dielectric layer 162 formed in the lower portion of the active trench 120a, and the third dielectric layer 163 surround the shielding electrode 165 and can commonly serve as the shielding dielectric layer. Accordingly, the third dielectric layer 163 is interposed between the second dielectric layer 162 and the shielding electrode 165. In one embodiment, a top face of the third dielectric layer 163 is located at a level lower than a lowest edge of the body region 140 to ensure the inversion channel can be formed in the body region 140.

Furthermore, the first and second dielectric layers 161, 162 extending from the upper portion to the lower portion of the active trench 120a can avoid the formation of the voids or holes in the active trench 120a, and attenuate the generation of the gate-source leakage current so as to improve the electrical performance of the power trench transistor.

In addition, in one embodiment, the second dielectric layer 162 has a dielectric constant greater than a dielectric constant of the first dielectric layer 161. In other words, the first dielectric layer 161 and the second dielectric layer 162 are respectively made of different materials. However, the first dielectric layer 161 and the third dielectric layer 163 can be made of the same or different materials. For example, the first and third dielectric layers 161, 163 can be made of, but are not limited to, oxide (such as silicon oxide), and the second dielectric layer 162 can be made of nitride, such as silicon nitride, or the other materials having higher dielectric constant, such as hafnium oxide, yttrium oxide or alumina.

Therefore, compared to the prior art gate dielectric only made of silicon oxide, the gate dielectric of the instant embodiment, i.e., the first and second dielectric layers 161, 162 formed in the upper portion of the active trench 120a, can have higher capacitance, i.e., higher gate-to-channel capacitance (Cgs). It is worth noting that when a bias is applied to the gate electrode 167 so as to form the inversion channel in the body region 140, the gate-to-channel capacitance is in inverse proportion with the inversion channel resistance. Accordingly, the inversion channel resistance decreases as the gate-to-channel capacitance increases. In addition, since the inversion channel resistance is proportional to the source/drain on resistance, when the inversion channel resistance decreases, the source/drain on resistance of the trench power transistor would be reduced.

However, the material for forming the first to third dielectric layers 161-163 may be chosen from various insulating materials according to the actual need not only for achieving the above results, and the instant disclosure is not limited thereto.

In the instant embodiment, the total thickness of the first dielectric layer 161 and the second dielectric layer 162 can be determined based on the withstand voltage of gate electrode of the trench power transistor (about 12V to 25V). Specifically, the first dielectric layer 161 has a thickness ranging from 10 to 35 nm, and the second dielectric layer 162 has a thickness ranging from 20 to 30 nm, and the third dielectric layer 163 has a thickness ranging from 50 to 200 nm. The breakdown voltage of the trench power transistor is relative to thickness of the third dielectric layer 163.

Please refer to FIG. 1. In the instant embodiment, the epitaxial layer 120 further includes a termination trench 120b formed in the termination region TR. Furthermore, the trench power transistor 1 includes a terminal electrode structure 170. Specifically, the terminal electrode structure 170 includes a terminal electrode 172 positioned in the termination trench 120b, and a termination dielectric layer 171 for isolating the terminal electrode 172 from the epitaxial layer 120.

To be more specific, the termination dielectric layer 171 is conformingly formed on an inner wall of the termination trench 120b, and has a contour substantially conforming to that of the inner wall of the termination trench 120b. In the instant embodiment, the termination dielectric layer 171 has a stacked layer structure. The stacked layer structure includes a first oxide layer 171a, a nitride layer 171b, and a second oxide layer 171c, which are sequentially stacked along a direction from the inner wall of the termination trench 120b to the terminal electrode 172. That is to say, the nitride layer 171b of the termination dielectric layer 171 is sandwiched between the first and second oxide layers 171a, 171b.

The trench power transistor 1 of the instant embodiment further includes an interlayer dielectric layer 180, at least one source conductive plug 184, and a conductive layer 190.

Please refer to FIG. 1. The interlayer dielectric layer 180 is disposed on the epitaxial layer 120, and the interlayer dielectric layer 180 has a passivation layer 181 and a planar layer 182.

In the instant embodiment, the passivation layer 181 is directly disposed on a top surface of the epitaxial layer 120, and has a stacked layer structure. To be specific, the passivation layer 181 includes a first film 181a formed on the top surface of the epitaxial layer 120, and a second film 181b formed on the first film 181a. The materials of the first and second films 181a, 181b can be respectively the same as the materials of the first and second dielectric layers 161, 162. In other words, when the first dielectric layer 161 is an oxide layer, and the second dielectric layer 162 is a nitride layer, the passivation layer 181 also includes an oxide (first film 181a)/nitride (second film 181b) stacked layer structure. Under these conditions, the first film 181a and the first dielectric layer 161 can be formed during the same deposition process. Similarly, the second film 181b and the second dielectric layer 162 also can be formed during the same deposition process. The detail steps of the deposition process will be explained in the following description, and is omitted now.

In another embodiment, the materials of the first and second films 181a, 181b also can be different from that of the first and second dielectric layers 161, 162, and the instant disclosure is not limited thereto. The planar layer 182 is formed on the passivation layer 181 so that the conductive layer 190 can be formed thereon. The planar layer 182 can be made of the material selected from the group consisting of borophosphosilicate glass (BPSG), phosphosilicate glass (PSG), oxide, nitride, and the combination thereof.

Additionally, the interlayer dielectric layer 180 has at least one source contact opening 183. In the instant embodiment, the source contact opening 183 extends from the upper surface of the interlayer dielectric layer 180 into the epitaxial layer 120 positioned at one side of the source region 150. The epitaxial layer 120 includes a contact doping region 121 at a bottom of the source contact opening 183. In one embodiment, the epitaxial layer 120 is implanted with boron difluoride (BF2$^+$) through the source contact opening 183 to form the contact doping region 121.

However, the position of the source contact opening 183 can be varied according to the device design, and is not limited to the example provided herein. In another embodiment, the source contact opening 183 can be formed at a position above and corresponding to the source region 150.

The source conductive plug 184 is formed in the source contact opening 183 to electrically connect to the source region 150. To be specific, the source conductive plug 184 formed in the source contact opening 183 is directly in contact with the source region 150 and the contact doping region 121 formed in the epitaxial layer 120 to form an ohmic contact between the source conductive plug 184 and the source region 150. The source conductive plug 184 can be made of metal, such as, but not limited to, tungsten, copper, nickel, or aluminum.

The conductive layer 190 covers the planar layer 182 and can be electrically connected to the source region 150 through the source conductive plug 184 penetrating into the interlayer dielectric layer 180. That is to say, the conductive layer 190 can serve as a source terminal of the trench power transistor 1 for electrically connecting to an external control circuit. The material of the conductive layer 190 can be titanium (Ti), titanium nitride (TiN), tungsten (W). Al—Si alloy or A-Si—Cu alloy, but the material of the conductive layer 190 is not limited to the examples provided herein.

Figure 2:
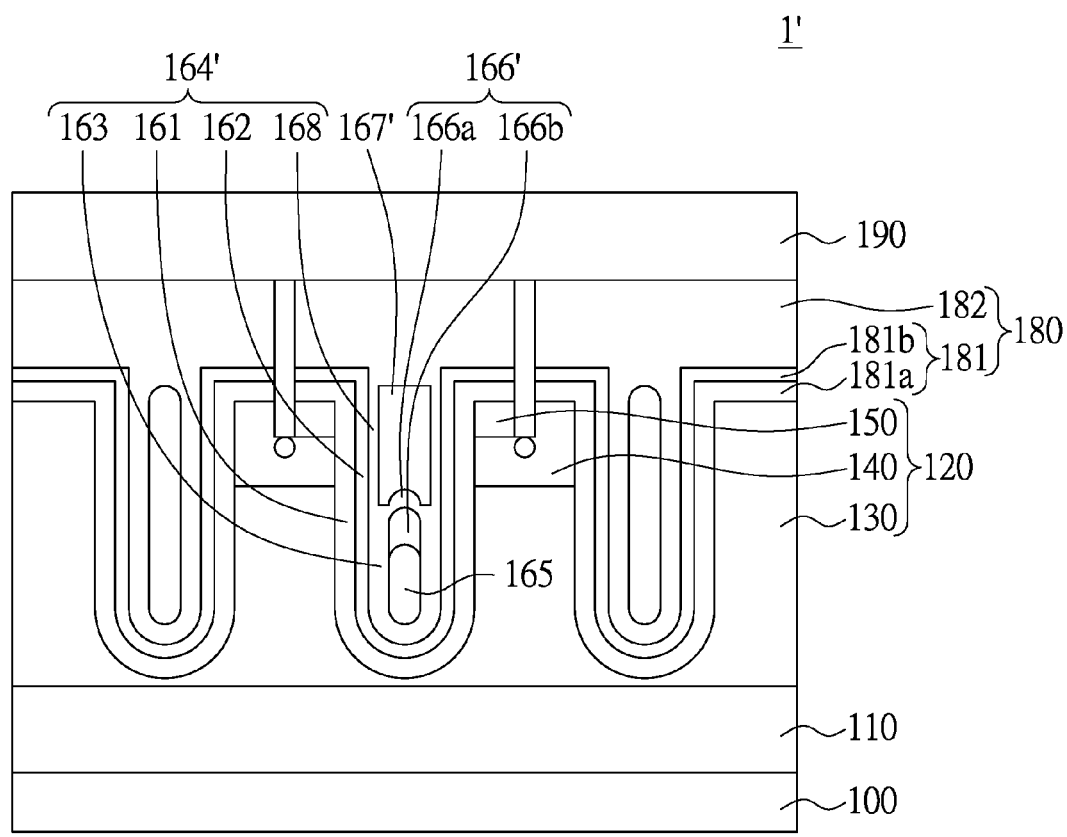
FIG. 2 shows a partial sectional view of a trench power transistor provided in accordance with another embodiment of the instant disclosure.

Please refer to FIG. 2. FIG. 2 shows a partial sectional view of a trench power transistor provided in accordance with another embodiment of the instant disclosure. The same reference numerals are given to the same components or to components corresponding to those in FIG. 1, and descriptions of the common portions are omitted.

A difference between this embodiment shown in FIG. 2 and the previous embodiment shown in FIG. 1 is the insulating layer 164' of the trench gate structure in the trench power transistor 1' further includes a fourth dielectric layer 168. The fourth dielectric layer 168 is formed in the upper portion of the active trench 120a, and sandwiched between a side surface of the gate electrode 167 and the second dielectric layer 162.

In the instant embodiment, the first, second, and fourth dielectric layers 161, 162, and 168 can act as the gate dielectric layer of the trench gate structure. In one embodiment, the material of the fourth dielectric layer 168 can be the same as the material of the first dielectric layer 161. For example, both the first and fourth dielectric layer 161, 168 can be made of silicon oxide. Furthermore, in the instant embodiment, a total thickness of the first, second, and fourth dielectric layers 161, 162, and 168 can be determined based on a withstand voltage of the gate electrode of the trench power transistor, which usually ranges from 12V to 25V. Specifically, compared to the previous embodiment shown in FIG. 1, the first dielectric layer 161 has thinner thickness of about 10 nm, and the second dielectric layer 162 has substantially the same thickness ranging from 20 nm to 30 nm as given in the previous embodiment. In addition, the third dielectric layer 163 has a thickness ranging from 50 nm to 200 nm, and the fourth dielectric layer 168 has a thickness ranging from 10 to 25 nm.

Furthermore, the inter-electrode dielectric layer 166' includes a first insulating layer 166a and a second insulating layer 166b, which are sequentially stacked on the shielding electrode 165. That is, in the instant embodiment, the inter-electrode dielectric layer 166' has a stacked layer structure. In one embodiment, the second insulating layer 166b and the fourth dielectric layer 168 can be made of the same material, and formed during the same fabrication process, but the instant disclosure is not limited thereto.

In the instant disclosure, a manufacturing method of the trench power transistor is provided. Please refer to FIG. 3, which shows a flowchart illustrating the manufacturing method of the trench power transistor provided in accordance with an embodiment of the instant disclosure. In addition, please refer to FIGS. 4A to 4K, which respectively show schematic sectional views of the trench power transistor in different steps of the manufacturing method provided in accordance with an embodiment of the instant disclosure.

In step S300, a substrate is provided. Subsequently, in step S301, an epitaxial layer is formed on the substrate. Please refer to FIG. 3 in conjunction with FIG. 4A. FIG. 4A shows the substrate 100 and the epitaxial layer 120, and the epitaxial layer 120 is formed on the substrate 100. The substrate 100, such as a silicon substrate, includes a first heavily doped region with high doping concentration to serve as a drain of the trench power transistor. The epitaxial layer 120 has lower doping concentration.

In the instant embodiment, before the step of forming the epitaxial layer 120 on the substrate 100, the manufacturing method further includes a step of forming a buffer layer 110 on the substrate 100. As shown in FIG. 4A, the buffer layer 110 is disposed between the substrate 100 and the epitaxial layer 120. In addition, the buffer layer 110 has the same conductivity type as the substrate 100 and the epitaxial layer 120, but the buffer layer 110 has a doping concentration between that of the substrate 100 and the epitaxial layer 120. Furthermore, in the instant embodiment, the epitaxial layer 120 defines an active region AR and a termination region TR.

Figure 3:
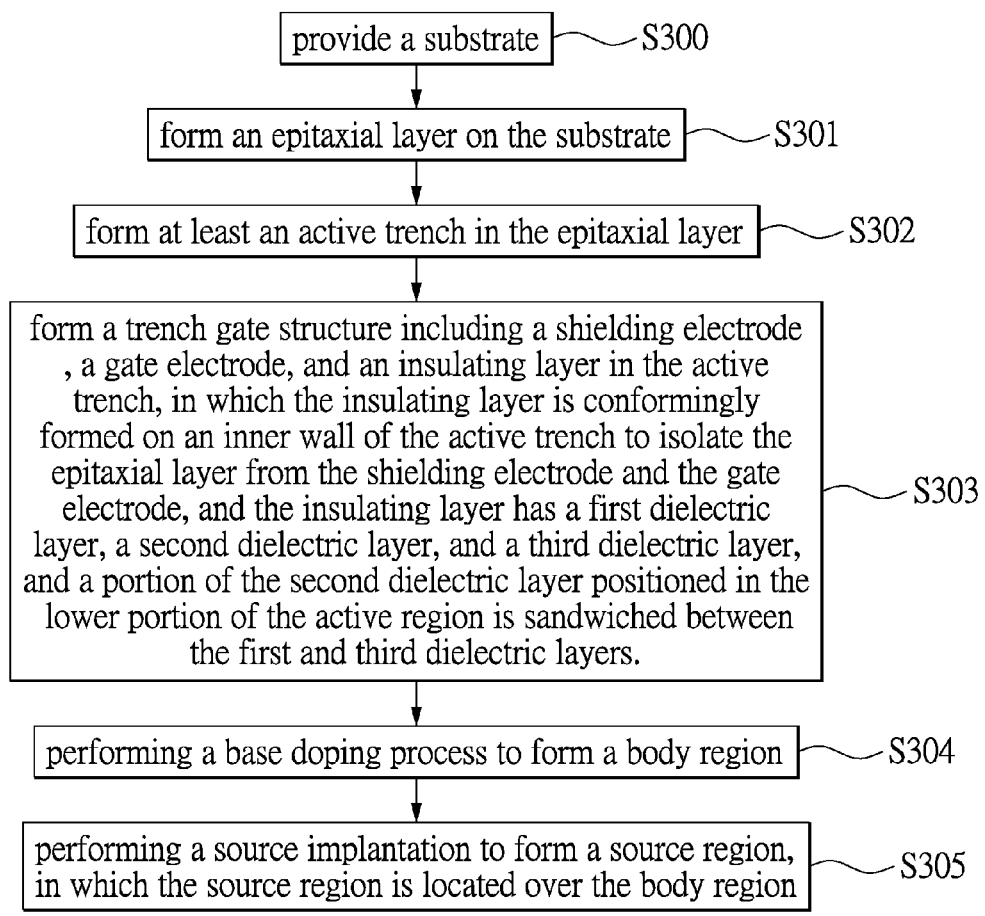
FIG. 3 shows a flowchart illustrating the manufacturing method of the trench power transistor provided in accordance with an embodiment of the instant disclosure.
Figure 4A:
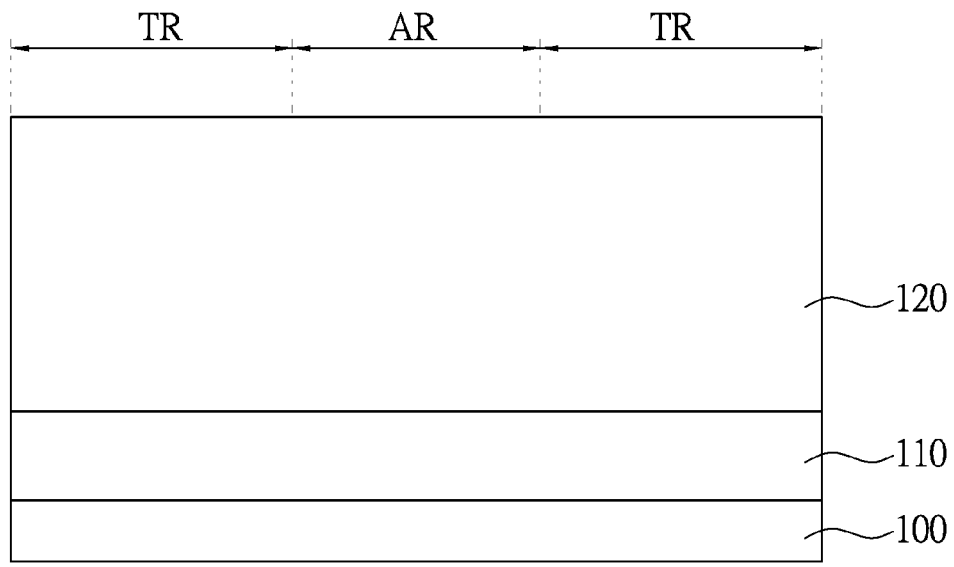
FIGS. 4A to 4K respectively show schematic sectional views of the trench power transistor in different steps of the manufacturing method provided in accordance with an embodiment of the instant disclosure.

Please refer to FIG. 3. Subsequently, in step S302, at least one active trench is formed in the epitaxial layer. The manufacturing method of the trench power transistor provided in the instant embodiment may further include a step of forming a termination trench in the epitaxial layer during the step of forming the active trench.

Figure 4B:
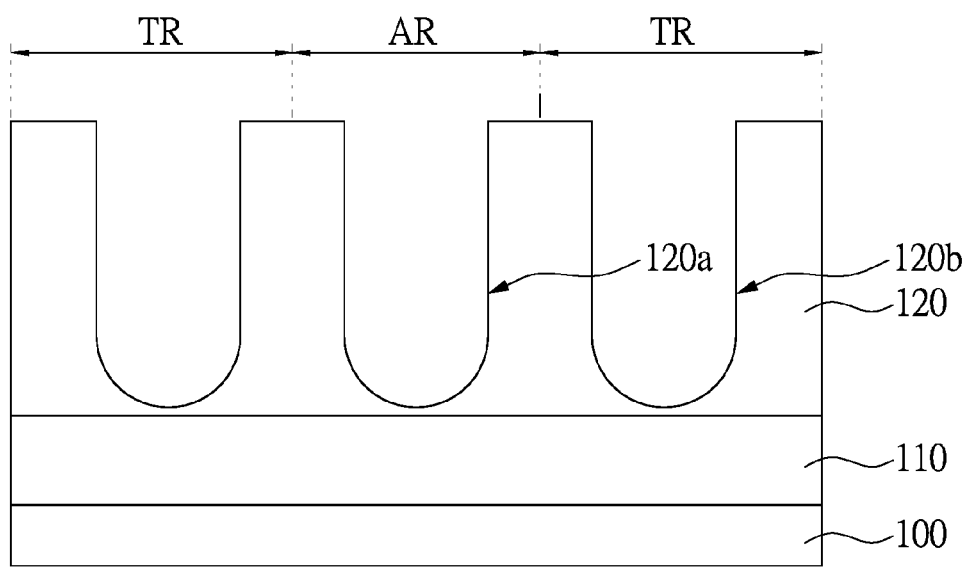

Please refer to FIG. 4B. Specifically, the active trench 120a is formed in the active region AR, and the termination trench 120b is formed in the termination region TR. In one embodiment, the positions of the active trench 120a and the termination trench 120b can be defined by forming a photomask (not shown in FIG. 4B), thereafter, the epitaxial layer 120 is etched by wet or dry etching process to form the active trench 120a and the termination trench 120b therein Subsequently, please refer to FIG. 3. In step S303, a trench gate structure is formed in the active trench, in which the trench gate structure includes a shielding electrode, a gate electrode, and an insulating layer, and the insulating layer is conformingly formed on an inner wall of the active trench and isolates the epitaxial layer from the shielding electrode and from the gate electrode. The insulating layer includes a first dielectric layer, a second dielectric layer, and a third dielectric layer, in which the third dielectric layer is formed in a lower portion of the active trench, and a portion of the second dielectric layer positioned in the lower portion of the active trench is sandwiched between the first and third dielectric layers.

In addition, the manufacturing method of the trench power transistor further includes a step of forming a terminal electrode structure in the termination trench. In addition, the terminal electrode structure and the trench gate structure can be formed synchronously. The terminal electrode structure includes a terminal electrode and a termination dielectric layer, in which the termination dielectric layer is conformingly formed on an inner wall of the termination trench to isolate the terminal electrode from the epitaxial layer. The termination dielectric layer includes at least two oxide layers and a nitride layer interposed therebeween.

Figure 4C:
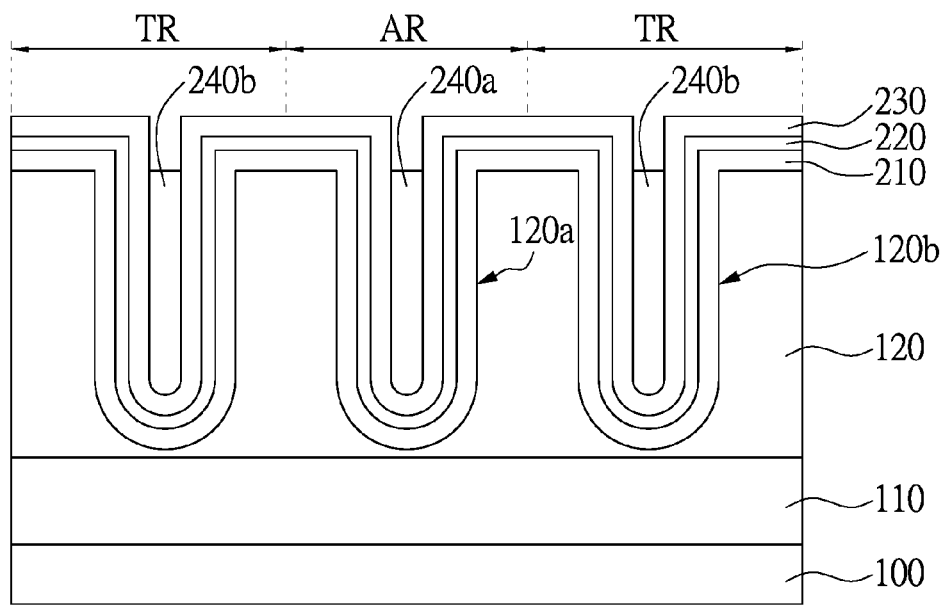

To be specific, please refer to FIG. 4C to FIG. 4H, which respectively show the process of forming the trench gate structure and the terminal electrode structure in detail. Please refer to FIG. 4C. As shown in FIG. 4C, a first dielectric material 210, a second dielectric material 220, and a third dielectric material 230 are blanketly formed on a top surface of the epitaxial layer 120, and the inner wall (including two side wall surfaces and a bottom surface) of the active trench 120a and the inner wall of termination trench 120b. The first dielectric material 210 can be silicon oxide (SiOx) formed by a thermal oxidation process. In another embodiment, the first dielectric material 210 can be formed by a physical vapor deposition (PVD) process or a chemical vapor deposition (CVD) process.

In one embodiment, the second dielectric material 220 has a higher dielectric constant than that of the first dielectric material 210. For example, when the first dielectric material 210 is silicon oxide, the second dielectric material can be nitride, such as silicon nitride. In addition, the second dielectric material also can be deposited by physical vapor deposition (PVD) process or chemical vapor deposition (CVD) process to conformingly cover the first dielectric material 210.

The third dielectric material 230 can be oxide or nitride, such as silicon oxide (SiO$_2$), and the instant disclosure is not limited thereto. Furthermore, the deposition process, such as physical vapor deposition (PVD) process or chemical vapor deposition (CVD) process, of the third dielectric material 230 can be selected according to the material and actual demands.

In one embodiment, the first dielectric material 210 has a thickness ranging from 10 to 35 nm, the second dielectric material 220 has a thickness ranging from 20 to 30 nm, and the third dielectric material 230 has a thickness ranging from 50 to 200 nm.

After the deposition of the first to third dielectric materials 210-230, a first polysilicon structure is blanketly deposited on the third dielectric material 163 and the active trench 120a and the termination trench 120b are filled with the first polysilicon structure. The first polysilicon structure can be doped with conductive impurities. Subsequently, a portion of the first polysilicon structure formed on the third dielectric material 230 is removed by an etch-back process, and other portions 240a, 240b of the first polysilicon structure are respectively left in the active trench 120a and the termination trench 120b.

Figure 4D:
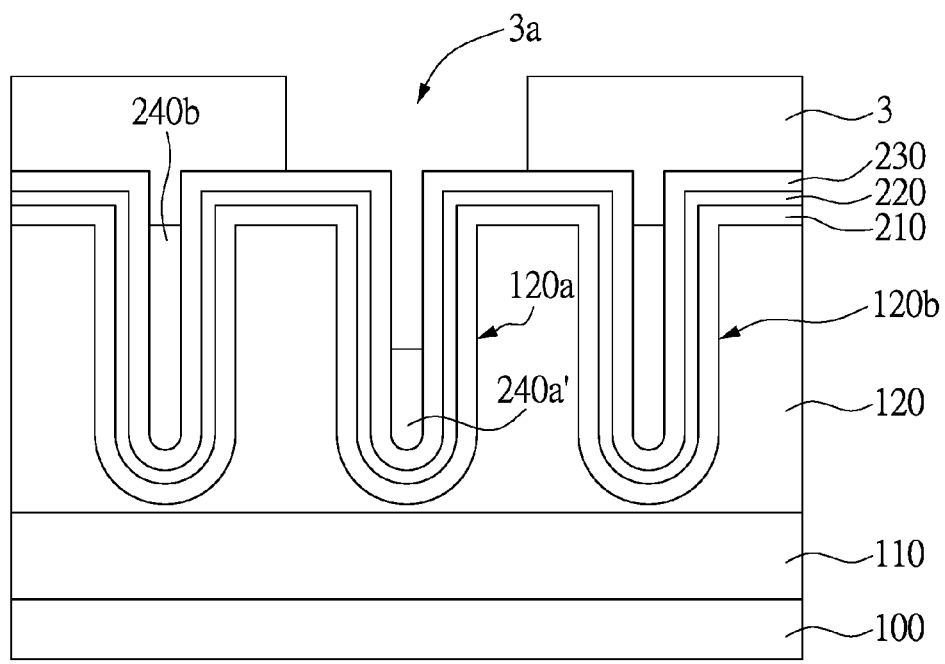

Subsequently, please refer to FIG. 4D. A photoresist layer 3 is formed on the third dielectric material 230, and the photoresist layer 3 has at least one opening 3a to expose the active trench 120a in the active region AR. That is to say, the photoresist layer 3 covers the termination trenches 120b in the termination region TR and a portion of the surface of the third dielectric material 230. Thereafter, an upper portion of the first polysilicon structure 240a in the active trench 120a is etched, and the remained first polysilicon structure 240a' is positioned in the lower portion of the active trench 120a. After the first polysilicon structure 240a is etched, the photoresist layer 3 is removed.

Figure 4E:
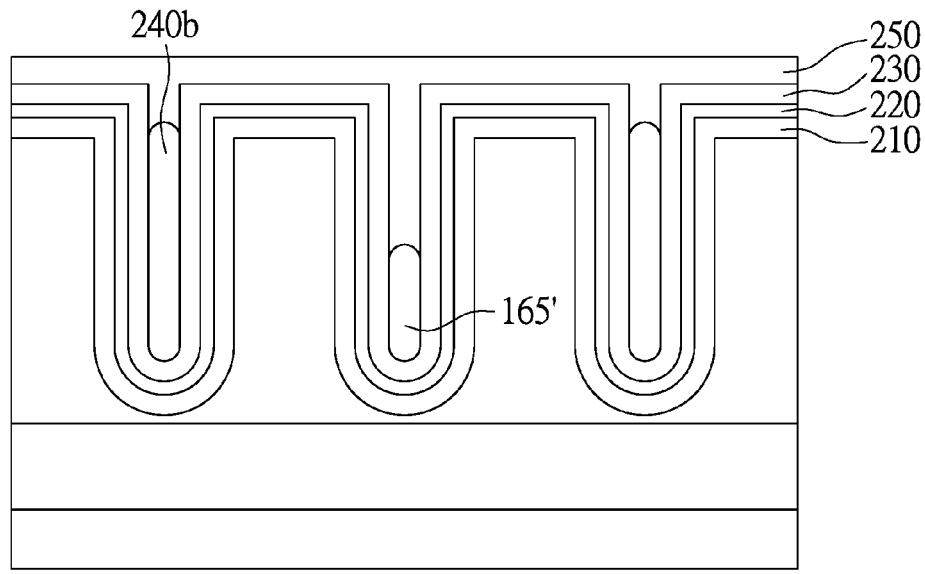

Subsequently, please refer to FIG. 4E. An oxide layer 250 is formed to cover the surface of the third dielectric material 230 and the active trench 120a and the termination trench 120b are filled with the oxide layer 250. It is worth noting that during the process of forming the oxide layer 250, a top portion of the remained first polysilicon structure 240a' in the lower portion of the active trench 120a, and a top portion of each first polysilicon structure 240b in the termination trenches 120b are slightly oxidized. After the aforementioned steps, the process of forming the shielding electrode 165' in the lower portion of the active trench 120a is substantially completed.

Figure 4F:
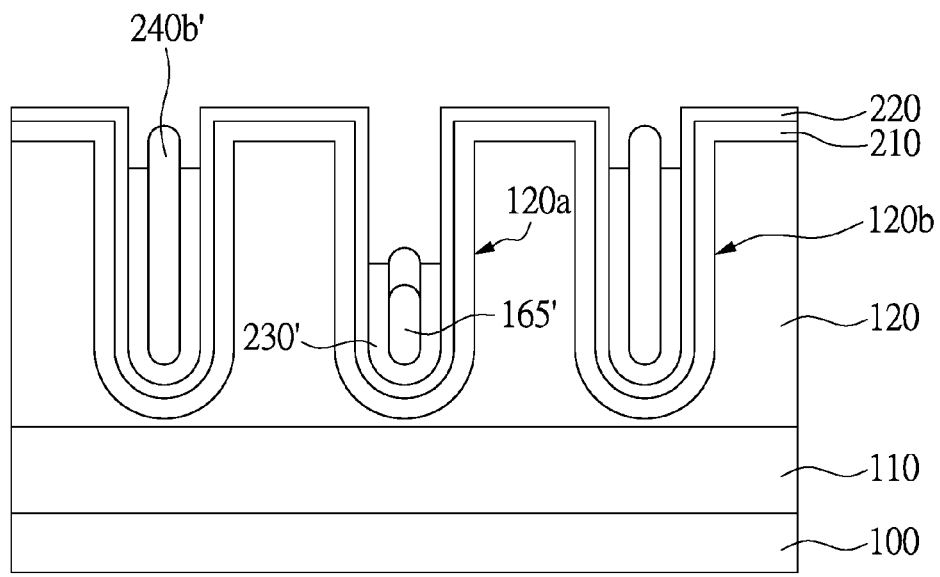

Please refer to FIG. 4F. A portion of the oxide layer 250 formed on the epitaxial layer 120 and in the upper portion of the active trench 120a is removed, and the remained oxide layer 250' is positioned on the top of the shielding electrode 165'. The function of the remained oxide layer 250' can be equivalent to the inter-electrode dielectric layer 166 shown in FIG. 1.

In addition, during the step of removing the portion of the oxide layer 250, a portion of the third dielectric material 230, which is formed on the epitaxial layer, in the active trench 120a and in the termination trench 120b, is removed. Specifically, in the active trench 120a, the portion of the third dielectric material 230 covering the inner wall of the upper portion of the active trench 120a is removed, and the remained third dielectric material 230' covers the inner wall of the lower portion of the active trench 120a to form the third dielectric layer 163 as shown in FIG. 1 and FIG. 2.

Figure 4G:
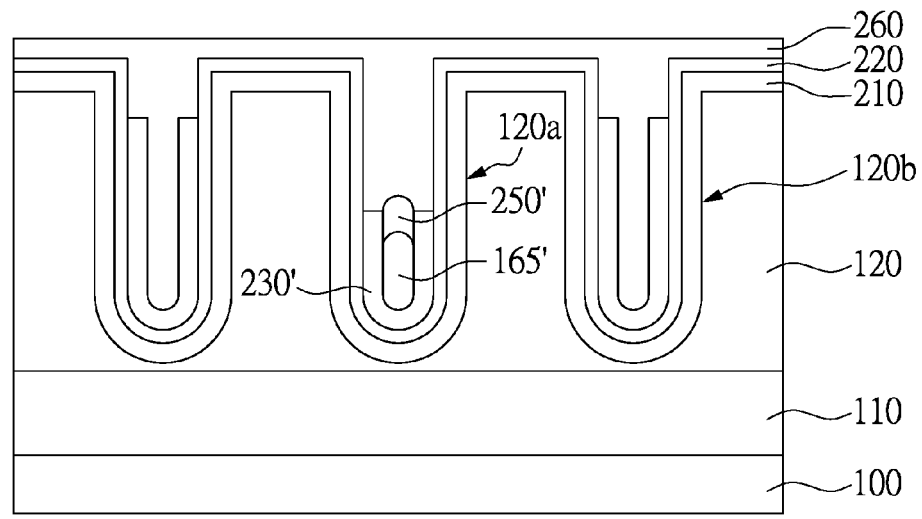

Please refer to FIG. 4G. Subsequently, a second polysilicon structure 260 is formed to blanketly cover the top surface of the epitaxial layer 120 and the active trench 120a and termination trench 120b is filled with the second polysilicon structure 260. To be specific, the second polysilicon structure 260 covers the surface of the second dielectric materials 220, and a remained space of the upper portion of the active trench 120a and a remained space of the termination trench 120b are filled with the second polysilicon structure 260. The means for forming the second polysilicon structure 260 can be the same as the means for forming the first polysilicon structure, and is omitted herein.

Figure 4H:
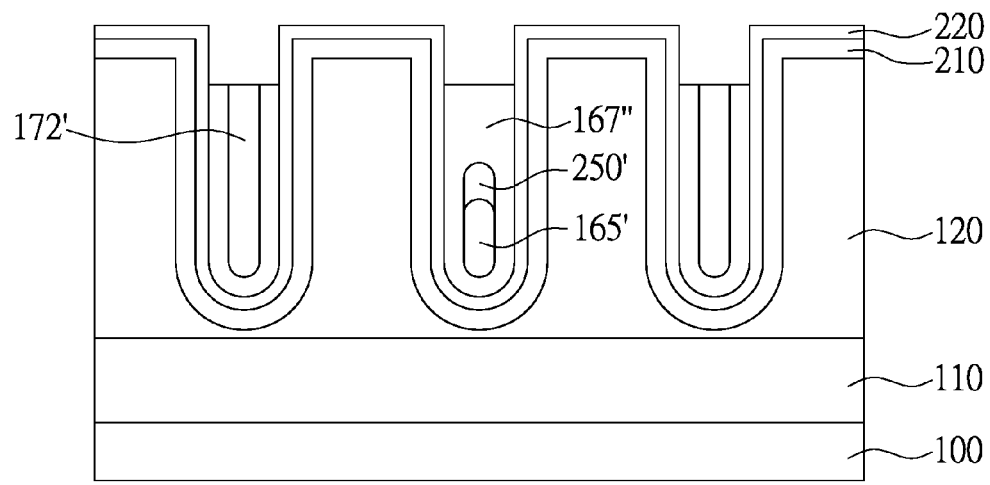

Please refer to FIG. 4H. The second polysilicon structure 260 is etched back so as to remove a portion of the second polysilicon structure 260 formed on the epitaxial layer 120 to form a gate electrode 167" in the active trench 120a and a terminal electrode 172' in the termination trench 120b. Accordingly, the first and second dielectric materials 210, 220 formed on the inner wall of the active trench 120a can be respectively equivalent to the first dielectric layer 161 and the second dielectric layer 162 shown in FIG. 1.

Notably, during the processes of forming the trench gate structure and the terminal electrode structure, the first and second dielectric materials 210, 220 are not removed. Therefore, unlike the prior art, the active trench 120a of the embodiment provided in the instant disclosure would not have the voids and holes formed therein, such that the gate-source leakage current can be attenuated and quality can improve.

Please refer to FIG. 3. Proceed to step S304 and step S305. In step S304, a base doping process is carried out in the epitaxial layer to form a body region. In step S305, a source implantation is performed to form a source region, and the source region is located over the body region.

Figure 4I:
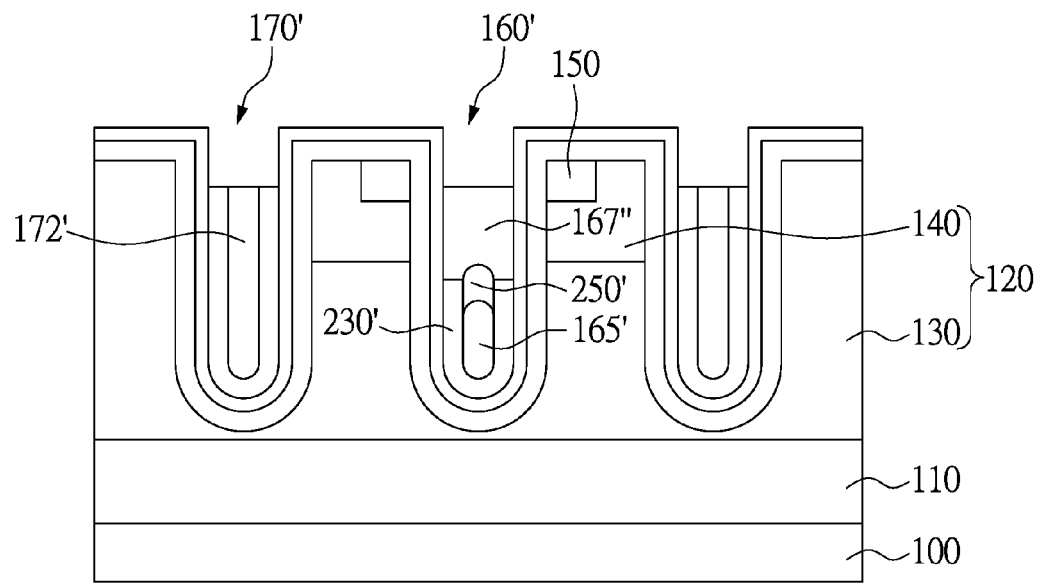

Please refer to FIG. 4I. The epitaxial layer 120 is doped by performing the base doping process to form a first doped region. The first doped region is formed at one side far from the substrate 100. After the formation of the first doped region, the source implantation is performed to implant the first doped region to form the source region 150 and the body region 140. Specifically, after an ion implantation is performed to implant the first doped region, a thermal diffusion process is performed to form the source region 150. Additionally, as shown in FIG. 4I, in the instant embodiment, the lowest edge of the body region 140 is higher than a level at which the top face of the third dielectric material 230' is located The manufacturing method of a trench power transistor of the embodiment in the instant disclosure can further include a step of forming a redistribution layer on the epitaxial layer so that the source region, the gate electrode and the shielding electrode can be electrically connected to an external control circuit. In the following description, take the formation of the source conductive plug shown in FIG. 1 as an example, to explain the steps of forming the redistribution layer in more detail in conjunction with FIG. 4J to FIG. 4K.

Figure 4J:
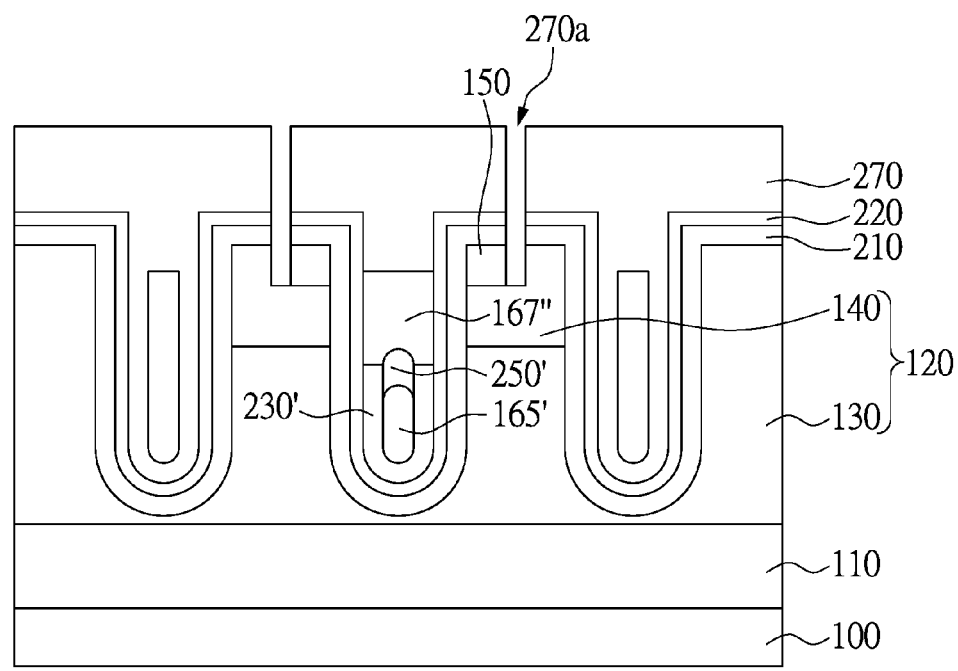

Please refer to FIGS. 4I and 4J. A planar layer 270 is formed to cover a whole surface of the second dielectric material 220, the trench gate structure 160' and the terminal electrode structure 170'. The material of the planar layer 270 can be selected from the group consisting of borophosphosilicate glass (BPSG), phosphosilicate glass (PSG), oxide, nitride, and the combination thereof.

Subsequently, at least one source contact opening 270a (two source contact openings are shown in FIG. 4J) is formed corresponding to the position of the source region 150. In the instant embodiment, the formation of the source contact opening 270a can be carried out by the well-known steps of photoresist coating, exposure, development, etching, and so on.

Figure 4K:
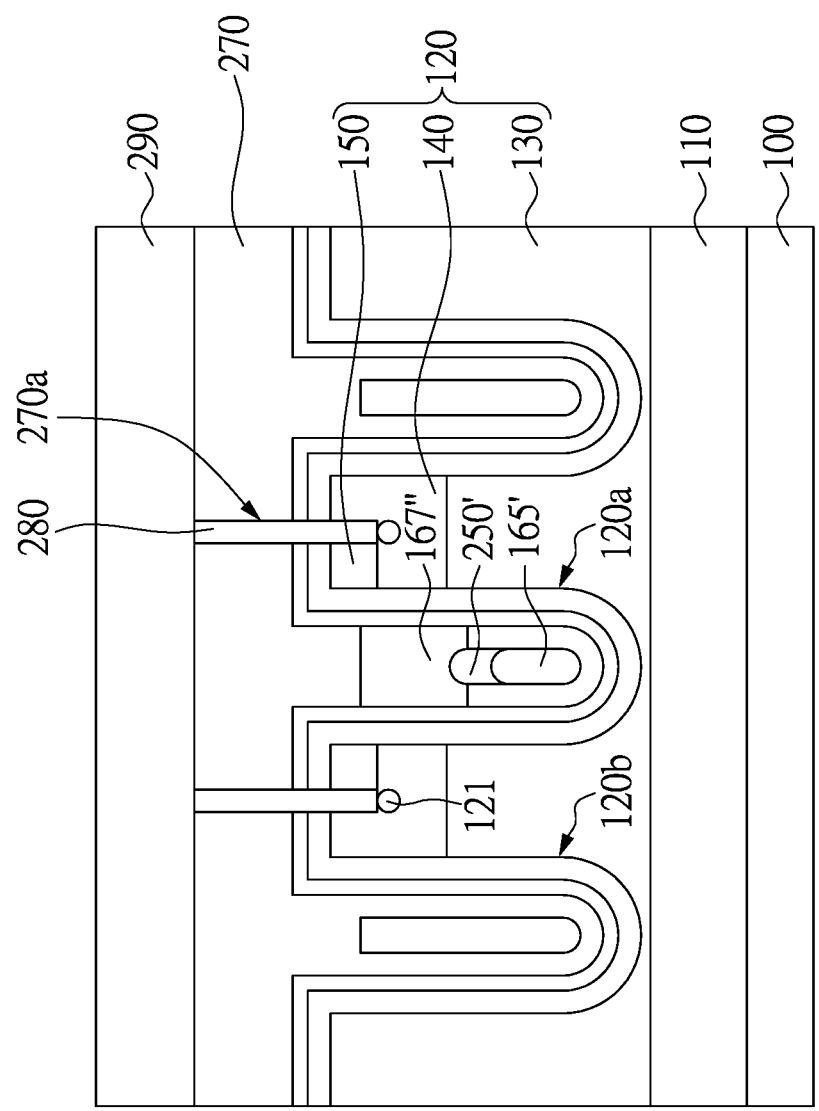

Please refer to FIG. 4K. Thereafter, a source conductive plug 280 is formed in the corresponding source contact opening 270a. Notably, the source conductive plug 280 penetrates into the planar layer 270, the first dielectric material 210 and the second dielectric material 220. Furthermore, the source conductive plug 280 extends into the epitaxial layer 120 located at one side of the source region 150 so as to electrically connect to the source region 150.

It is worth noting that before the step of forming the source conductive plug 280 in the corresponding source contact opening 270a, a doping process is performed on the epitaxial layer 120 through the source contact opening 270a in order to form a contact doping region 121 at a bottom of the source contact opening 270a. In one embodiment, the contact doping region 121 is implanted with boron difluoride ($BF_2^+$).

Furthermore, after the step of forming the source conductive plug 280 in the corresponding source contact opening 270a, a conductive layer 290 can be formed to cover the planar layer 270 and to electrically connect to the source conductive plug 280. The conductive layer 290 can be made of titanium, titanium nitride, tungsten, Al—Si alloy or Al—Si—Cu alloy, but the instant disclosure is not limited thereto. The conductive layer 290 can be electrically connected to the source region 150 and the contact doping region 121 through the source conductive plug 280. According to the abovementioned embodiments, one of ordinary skill in the art can easily understand the other steps performed in the abovementioned embodiments in detail, and the relative descriptions are omitted herein.

For further explanation, the portions of the first and second dielectric materials 210, 220 formed on the top surface of the epitaxial layer 120 are equivalent to the passivation layer 181 shown in FIG. 1, and the planar layer 270 is equivalent to the planar layer 182 shown in FIG. 1. Furthermore, the first, second and third dielectric materials 210, 220, and 230 sequentially formed on the inner wall of the active trench 120a can function as the insulating layer 164 of the trench gate structure 160 shown in FIG. 1.

The manufacturing method of a trench power transistor in accordance with another embodiment of the instant disclosure is provided. Please refer to FIG. 5A to FIG. 5C, which respectively show schematic sectional views of the trench power transistor in different steps of the manufacturing method provided in accordance with another embodiment of the instant disclosure.

Figure 5A:
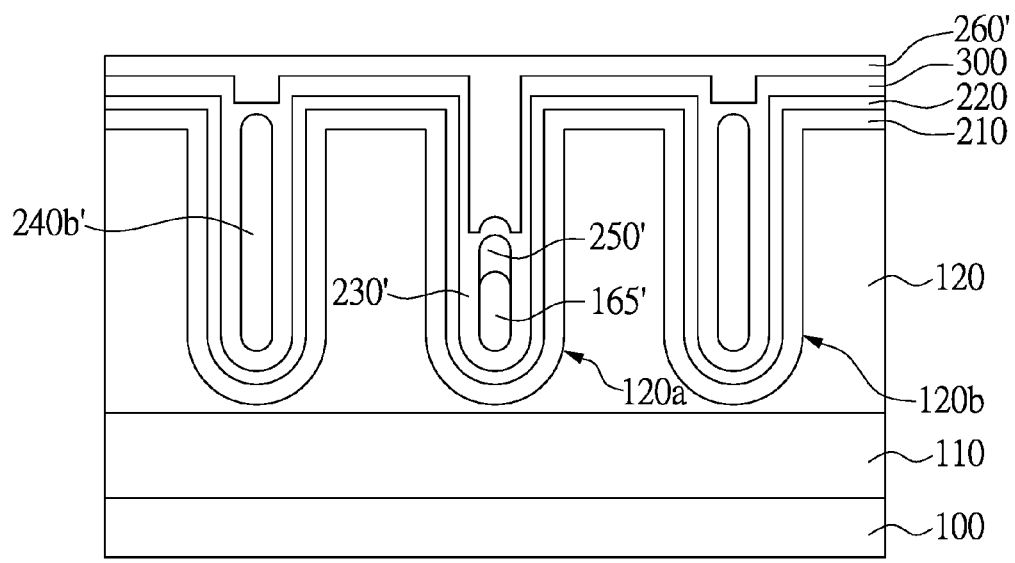
FIGS. 5A to 5C respectively show schematic sectional views of the trench power transistor in different steps of the manufacturing method provided in accordance with another embodiment of the instant disclosure.
Figure 5B:
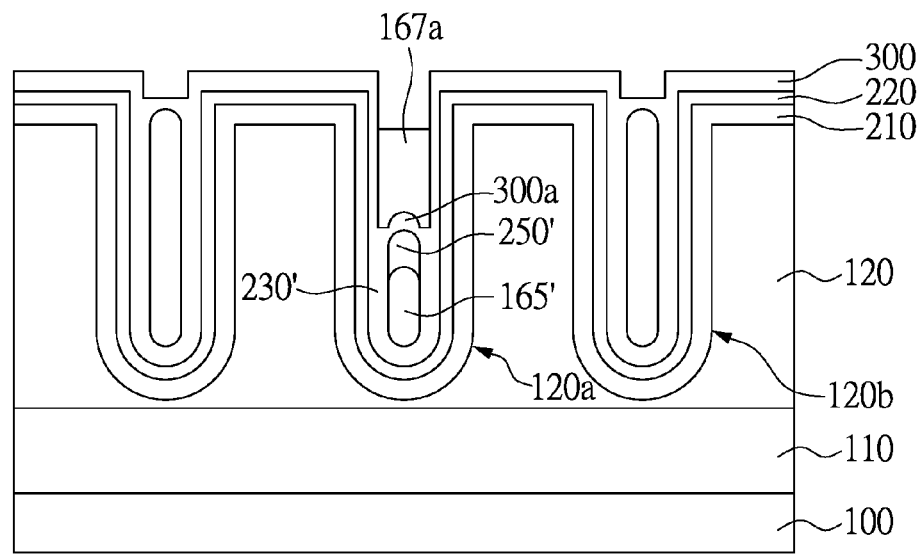

It is noted that before the step shown in FIG. 5A, the steps shown in FIGS. 4A to 4F have been performed. That is to say, the portion of the oxide layer 250 formed on the top surface of the epitaxial layer 120, and on the upper portion of the active trench 120a has been removed, and the remained oxide layer 250' is positioned at the top of the shielding electrode 165'. As shown in FIG. 5A, a fourth dielectric material 300 is formed to conformingly cover the surface of the second dielectric material 220 and in the active trench 120a and the termination trench 120b. The fourth dielectric material 300 can be made of oxide or nitride and formed by any well-known deposition process.

Subsequently, a second polysilicon structure 260' is blanketly deposited on the fourth dielectric material 300. The process for depositing the second polysilicon structure 260' can be similar to the previous description in conjunction with FIG. 4G, and is omitted herein Subsequently, please refer to FIG. 5B. A portion of the second polysilicon structure 260 formed on the top surface of the epitaxial layer 120 and covering the termination trench 120b is removed by etching back process, and another portion of the second polysilicon structure is remained in the active trench 120a to form the gate electrode 167a. As such, the first, second, third and fourth dielectric materials 210, 220, 230, and 300 can be equivalent to the insulating layer 164' shown in FIG. 2. In addition, the oxide layer 250' and the fourth dielectric layer 300a disposed between the first and second polysilicon structures 165', 260' can respectively equivalent to the first film 181a and the second film 181b shown in FIG. 2.

Figure 5C:
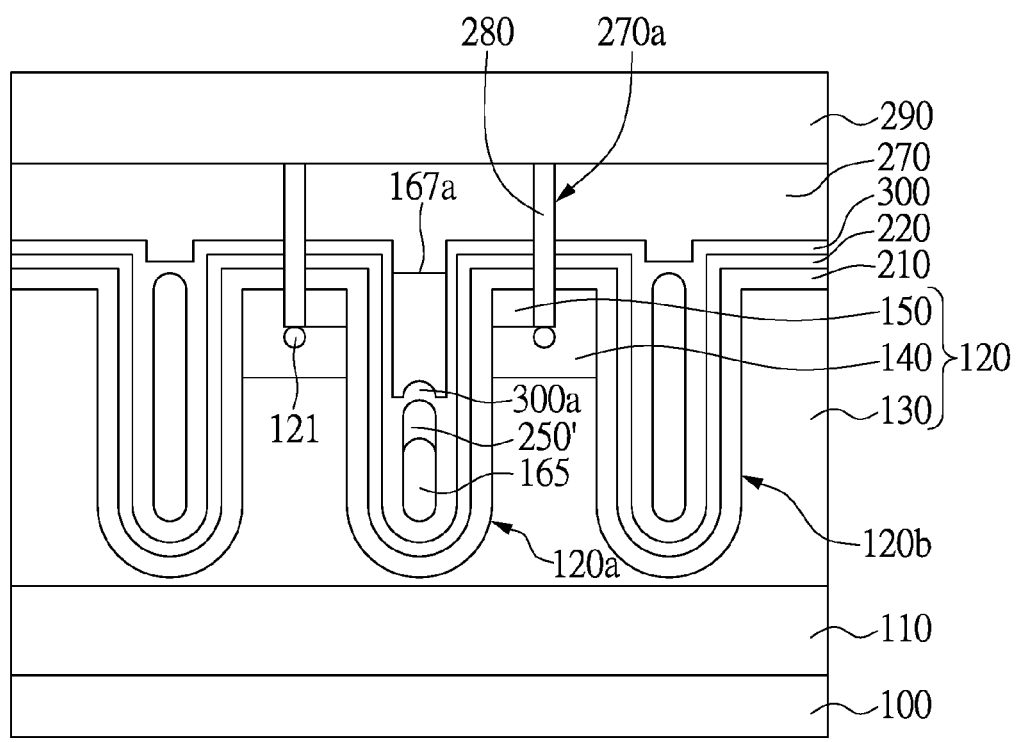

Please refer to FIG. 5C. Subsequently, the body region 140 and the source region 150 are formed in the epitaxial layer 120, and a redistribution layer is formed on the epitaxial layer 120, i.e., on the fourth dielectric material 300. The steps of forming the redistribution layer are similar to those shown in FIG. 4J to FIG. 4K, and include: forming a planar layer 270 to completely cover the surface of the second dielectric material 220, the trench gate structure and the terminal electrode structure; performing a doping process on the epitaxial layer 120 through the source contact opening 270a to form a contact doping region 121 at a bottom of the source contact opening 270a; forming a source conductive plug 280 in the corresponding source contact opening 270a; and forming a conductive layer 290 to cover the planar layer 270 and electrically connect to the source conductive plug 280. Accordingly, by performing the previous mentioned steps, the trench power transistor shown in FIG. 2 can be fabricated.

Figure 6:
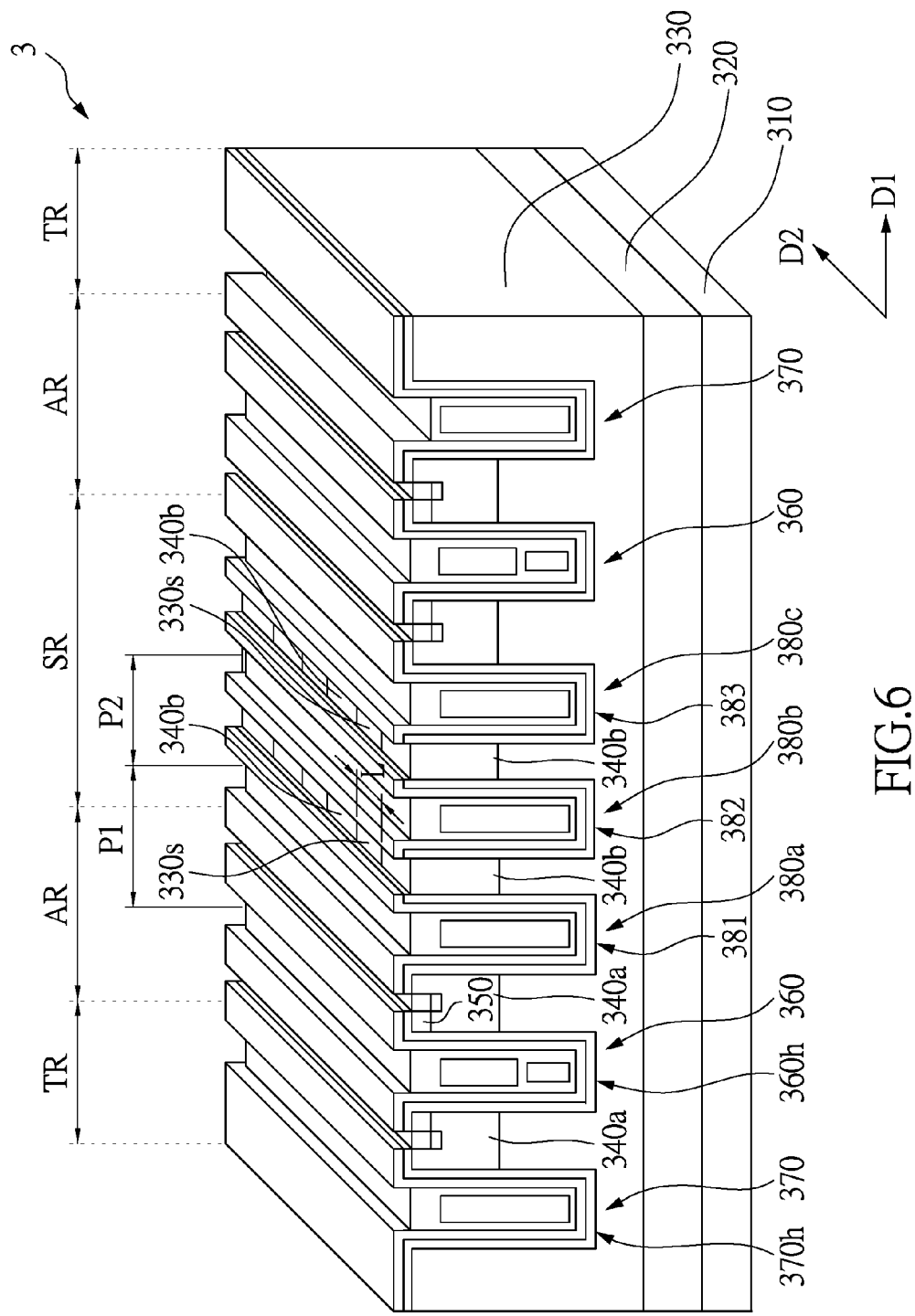
FIG. 6 shows a cross-sectional, perspective schematic view of the trench power transistor provided in accordance with another embodiment of the instant disclosure.

Please refer to FIG. 6. FIG. 6 shows a cross-sectional, perspective schematic view of the trench power transistor provided in accordance with another embodiment of the instant disclosure.

The trench power transistor 3 of the instant embodiment can serve as a low-side power transistor to be implemented in the voltage convert circuit. Specifically, the trench power transistor 3 of the instant embodiment can include a substrate 310, an epitaxial layer 330, a trench gate structure 360, a terminal electrode structure 370, first, second, and third terminal electrode structures 380a, 380b, 380c, a plurality of first body regions 340a, a plurality of second body regions 340b, and a source region 350. Additionally, similar to the embodiments shown in FIG. 1 and FIG. 2, a buffer layer 320 is interposed between the substrate 310 and the epitaxial layer 330. The description relative to the components similar to those in the embodiments shown in FIG. 1 and FIG. 2 will be omitted herein.

In the instant embodiment, the epitaxial layer 330 defines an active region AR, a termination region TR, and a rectifying region SR. The epitaxial layer 330 includes at least one active trench 360h formed in the active region AR, at least one termination trench 370h formed in the termination region TR, a first termination trench 381, a second termination trench 382, and a third termination trench 383, in which the first, second, and third termination trenches 381-383 are formed in the rectifying region SR.

The active trench 360h, the termination trench 370h, the first, second and third termination trenches 381-383 formed in the epitaxial layer 330 are arranged parallel to each other along a first direction D1. In the instant embodiment, the active trench 360h is immediately adjacent to and spaced from the first termination trench 381 by a first pitch P1. In addition, in the rectifying region SR, the first, second, and third termination trenches 381-383 are spaced apart from each other by a second pitch P2. The second pitch P2 is slightly smaller than the first pitch P1, and the differential value (P1-P2) between the first pitch P1 and the second pitch P2 ranges from 0.1 to 0.3 μm.

In the instant embodiment, the trench gate structure 360 formed in the active trench 360h may have similar structure to the trench gate structure 160 shown in FIG. 1 or FIG. 2. In addition, the first body regions 340a and the source region 350 formed in the epitaxial layer 330 are also positioned in the active region AR, and located at two sides of the trench gate structure 360.

The terminal electrode structure 370 positioned in the termination trench 370h may have similar structure to the terminal electrode structure 170 shown in FIG. 1 or FIG. 2. Similarly, each of the first, second, and third terminal electrode structures 380a-380c may have similar structure to the terminal electrode structure 170 shown in FIG. 1 or FIG. 2. The first, second, and third terminal electrode structures 380a-380c are respectively positioned in the first, second, and third termination trenches 381-383.

It is worth noting that the second body regions 340b are formed in the epitaxial layer 330 interposed between the adjacent first and second terminal electrode structures 380a, 380b, or between the adjacent second and third terminal electrode structures 380b, 380c.

Specifically, the second body regions 340b positioned between the adjacent first and second terminal electrode structures 380a, 380b are arranged along a second direction D2. The two adjacent second body regions 340b are mutually spaced apart a predetermined distance to define a schottky contact region 330s. In other words, the predetermined distance between the two adjacent second body regions 340b arranged along the second direction D2 is the length L of the schottky contact region 330s in the second direction D2. In one embodiment, the schottky contact region has the length L in the second direction D2 ranging from 0.6 to 1.2 μm. Furthermore, in the instant embodiment of the instant disclosure, the trench power transistor 3 can further include an interlayer dielectric layer (not shown in FIG. 6) formed on the epitaxial layer and at least one conductive plug (not shown) penetrating into the interlayer dielectric layer.

To be specific, the interlayer dielectric layer can have at least a contact window (not shown) corresponding to the schottky contact region 330s, and the conductive plug is in contact with and electrically connected to the schottky contact region 330s through the contact window to form a schottky diode.

Since the schottky diode has a lower forward voltage drop than the body diode, by integrating the schottky diode with the trench power transistor 3, the switching loss of the trench power transistor 3 can be reduced. In addition, the schottky diode has better reverse recovery characteristics than the body diode. When the trench power transistor is implemented in the higher frequency circuit, the switching loss of the trench power transistor can be significantly reduced.

In summary, in the power trench transistor and the manufacturing method thereof in the embodiment of the instant disclosure, after the steps of forming the oxide layer and the nitride layer on the top surface of the epitaxial layer and the inner wall of the active trench, the oxide layer directly in contact with the epitaxial layer and the nitride layer covering the oxide layer are not removed during the following process. In other words, the subsequent processes of forming the shielding electrode are performed under the condition of without removing the nitride layer. As such, the nitride layer covers the oxide layer and extends from the upper portion to the lower portion of the active trench, and the formation of the voids or holes in the insulating layer of the trench gate structure can be avoided. As such, when a bias is applied to the gate electrode, the generation of the gate-source leakage current can be attenuated, thereby the trench power transistor has better electrical performance.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A trench power transistor comprising:
   a substrate;
   an epitaxial layer formed on the substrate, wherein the epitaxial layer has at least one active trench formed therein;
   a trench gate structure formed in the active trench and comprising:
     a shielding electrode positioned in a lower portion of the active trench;
     a gate electrode positioned in the active trench and insulated from the shielding electrode; and an insulating layer formed in the active trench and having a contour substantially conforming to a contour of an inner wall of the active trench, wherein the gate electrode and the shielding electrode are isolated from the epitaxial layer by the insulating layer, and the insulating layer includes a first dielectric layer, a second dielectric layer, and a third dielectric layer positioned in the lower portion of the active trench, and a portion of the second dielectric layer is sandwiched between the first dielectric layer and the third dielectric layer, and the second dielectric layer has a higher dielectric constant than a dielectric constant of the first dielectric layer;

a body region formed in the epitaxial layer and surrounding the trench gate structure; and a source region formed in the epitaxial layer and located over the body region.

2. The trench power transistor according to claim 1, wherein the epitaxial layer further includes at least one termination trench formed in the epitaxial layer, and the trench power transistor comprises at least a terminal electrode structure formed in the termination trench, and the terminal electrode structure includes:

a terminal electrode formed in the termination trench; and a termination dielectric layer formed on an inner wall of the termination trench and having a contour substantially conforming to a contour of the inner wall of the termination trench, wherein the terminal electrode is insulated from the epitaxial layer by the termination dielectric layer, and the termination dielectric layer includes at least two oxide layers and a nitride layer interposed between the two oxide layers.

3. The trench power transistor according to claim 1, wherein the trench gate structure further includes an inter-electrode dielectric layer extending between the gate electrode and the shielding electrode.

4. The trench power transistor according to claim 1, wherein the first dielectric layer has a thickness ranging from 10 to 35 nm, the second dielectric layer has a thickness ranging from 20 to 30 nm, and the third dielectric layer has a thickness ranging from 50 to 200 nm.

5. The trench power transistor according to claim 1, wherein the insulating layer further includes a fourth dielectric layer formed in an upper portion of the active trench and sandwiched between the second dielectric layer and the gate electrode.

6. The trench power transistor according to claim 5, wherein the first dielectric layer has a thickness of 10 nm, the second dielectric layer has a thickness ranging from 20 to 30 nm, the third dielectric layer has a thickness ranging from 50 to 200 nm, and the fourth dielectric layer has a thickness ranging from 10 to 25 nm.

7. The trench power transistor according to claim 1, further comprising:

an interlayer dielectric layer formed on the epitaxial layer and having at least one source contact opening formed therein; and at least one source conductive plug formed in the source contact opening to electrically connect to the source region.

8. The trench power transistor according to claim 7, wherein the interlayer dielectric layer includes a passivation layer directly formed on the epitaxial layer and having an oxide/nitride stacked layer structure.

9. A trench power transistor comprising:

a substrate;

an epitaxial layer formed on the substrate and defining an active region and a rectifying region, wherein the epitaxial layer has at least one active trench formed in the active region, a first termination trench formed in the rectifying region, and a second termination trench formed in the rectifying region;

a trench gate structure formed in the active trench;

a first body region formed in the active region of the epitaxial layer and surrounding the trench gate structure;

a source region formed above the first body region;

a first terminal electrode structure formed in the first termination trench;

a second terminal electrode structure formed in the second termination trench, wherein the trench gate structure, the first terminal electrode structure, and the second terminal electrode structure are adjacently arranged parallel to each other along a first direction; and at least two second body regions formed in the epitaxial layer interposed between the adjacent first terminal electrode structure and the second terminal electrode structure and arranged along a second direction, wherein the two adjacent second body regions are mutually spaced apart a predetermined distance to define at least a schottky contact region.

10. The trench power transistor according to claim 9, wherein the first termination trench is spaced from the adjacent active trench by a first pitch and spaced from the adjacent second termination trench by a second pitch, and a differential value between the first pitch and the second pitch ranges from 0.1 to 0.3 µm.

11. The trench power transistor according to claim 9, wherein the predetermined distance between the two adjacent second body regions arranged along the second direction is a length of the schottky contact region in the second direction.

* * * * *